United States Patent
Kalus et al.

(10) Patent No.: US 7,302,090 B2
(45) Date of Patent: Nov. 27, 2007

(54) METHOD AND DEVICE FOR DETERMINING THE PROPERTIES OF AN INTEGRATED CIRCUIT

(75) Inventors: Christian K. Kalus, Müchen (DE); Iouri Malov, München (DE)

(73) Assignee: Synopsys, Inc., Mountain View, CA (US)

( * ) Notice: Subject to any disclaimer, the term of this patent is extended or adjusted under 35 U.S.C. 154(b) by 614 days.

(21) Appl. No.: 10/433,250

(22) PCT Filed: Nov. 30, 2001

(86) PCT No.: PCT/EP01/14005

§ 371 (c)(1),
(2), (4) Date: Mar. 8, 2004

(87) PCT Pub. No.: WO02/44699

PCT Pub. Date: Jun. 6, 2002

(65) Prior Publication Data

US 2004/0136587 A1   Jul. 15, 2004

(30) Foreign Application Priority Data

Nov. 30, 2000   (DE) ................................ 100 59 516

(51) Int. Cl.
*G06K 9/00* (2006.01)
(52) U.S. Cl. ...................... 382/145; 382/144; 430/311; 416/19; 703/14
(58) Field of Classification Search .................... 430/5, 430/296, 30, 311, 313; 360/122; 382/145, 382/149, 151, 257, 266, 285, 144; 356/384, 356/390, 394, 237.4, 237.5; 348/87, 126, 348/129, 130; 438/16; 250/559.04, 559.06, 250/559.07, 559.08, 559.2, 559.39, 559.45, 250/559.46; 703/13, 14; 716/19, 21
See application file for complete search history.

(56) References Cited

U.S. PATENT DOCUMENTS 6,091,845 A * 7/2000 Pierrat et al. ................ 382/144

* cited by examiner

*Primary Examiner*—Sheela Chawan
(74) *Attorney, Agent, or Firm*—Park, Vaughan & Fleming LLP

(57) ABSTRACT

Process for determination of properties, particularly, the integrity, of an integrated circuit by calculation, wherein a calculation-simulated image of the circuit is compared with a design of the circuit, and deviations between the image and design are detected.

19 Claims, 2 Drawing Sheets

METHOD AND DEVICE FOR DETERMINING THE PROPERTIES OF AN INTEGRATED CIRCUIT

The present invention relates to a process for determining the properties of an integrated circuit according to the preamble of claim 1 and a corresponding apparatus according to the preamble of claim 10. The invention further relates to a corresponding computer program, a corresponding computer program product with program coding means and an integrated circuit produced using the process according to the invention and/or the apparatus according to the invention.

In the production of highly integrated circuits the manufacturers occasionally come up against the resolution limits of the mask writers and/or optical steppers used. Distortions may occur, for example as the result of physical effects such as scattering or diffraction, which cause the figures on the mask to deviate unacceptably from the image of a design. Such deviations may eventually lead to electrical faults, e.g. caused by short circuits or breaks in power supply. Conventionally, complete circuit designs are checked by so-called DRC programs (design rule check programs) to see how far the design rules have been adhered to. These design rules include, for example, the smallest permissible size of an element below which the size must not fall, or the smallest permissible distance between adjacent structures. The problem is solved by software packages with a complexity of the order $O(N^2)$, wherein N is the number of elements in the circuit design. Purely geometric checking of this kind unearths infringements of design rules, e.g. elements which are too close together. Checking of this kind is incapable of discovering, for example, faults caused by the proximity effect. Such a process and a corresponding apparatus for checking the layouts of integrated circuits are known for example from U.S. Pat. No. 6,115,546.

DRC processes test the consistency of a design against design rules. Thus, DRC processes are useful processes for checking a structured result. However, DRC processes do not predict the extent to which infringements of the rules will occur on the printer circuit due, for example, to the lack of resolution of the projection equipment or to the optical proximity effect.

Processes are also known wherein critical points of a circuit design are verified by a simulation. The verification is based on the assumption that there are few critical types of objects within the circuit design and that these critical types, e.g. contact holes, are known beforehand. Under these conditions, which could be assumed regularly until recently in semiconductor research and manufacture, verification can be carried out by simulation. As soon as the technology was perfected by simulation to the extent that the critical types can be properly imaged and have a large enough process window, it is assumed that the entire circuit must function.

However, the work involved in simulation for verifying the integrity of the circuit design is increasing, not so much as a result of the increasing size of the circuits but rather as a result of the so-called "reticle enhancement techniques". These include optical proximity correction which signifies a substantial change to the design. In present-day modern designs, particularly logic designs and more especially those after proximity correction, it is no longer assumed that with a few critical figure types such as contact holes or connecting lines all the problems are in hand. The conditions can easily become difficult to monitor owing to the local application of "serifs" and auxiliary structures and lead to undiscovered weak spots. This is one of the most important applications of the present invention.

In semiconductor manufacture, inspection equipment is used in mass production for examining masks and the actual circuits printed on to silicon chips. The job of the inspection equipment is to find defects, such as dust particles. Inspection equipment of this kind is known, for example, from U.S. Pat. Nos. 5,563,702 and 5,619,429. Such equipment generally operates according to one of the two processes described hereinafter:

In a first process two circuits are compared with one another (known as die-to-die in English), in which after careful adjustment of the circuits relative to one another they are scanned with a fine laser beam. If differences are found between the two circuits these are then classified and labelled as defective. With this process it is not possible to discover systematically produced deviations as they may occur in both circuits.

The second commonly used process uses a comparison of the circuit with a database (in English, die-to-database). In such processes the circuit to be examined is optically scanned and the signals obtained are compared with the rated geometry of a design. This process is capable of detecting defects even when there is no reference object. However, as there is a risk that deviations from the rated geometry of the design will be interpreted as defects, it is possible for deviations caused by the process to be wrongly interpreted as defects.

None of the processes described is designed for or capable of recognizing process-induced differences between the planned design and the structured object or circuit. An additional characteristic of all conventional inspection processes is that they are merely passive in effect, i.e. they cannot provide or propose any active change, and in particular any improvement to an existing design.

The inspection equipment mentioned above is designed to find defects. It fundamentally presumes functioning process technology. The implicit prerequisite for producing an inspection device of the usual construction is that the geometry of the design should be transferred with no distortions to a silicon chip. In other words, both the mask production process and the structuring on the silicon chip by an optical projection apparatus (stepper) are assumed to be ideal. However, at the forefront of current technology, this prerequisite is not satisfied, with the result that printed circuits deviate more and more from their respective designs. This is due on the one hand to the fact that the optical imaging apparatus acts as a low pass filter and on the other hand to the fact that all the subsequent components of the process, such as photoresists and the etching techniques used, produce more and more distortions.

Deviations in process technology can be detected using the traditional "trial and error" method in which a circuit is actually printed and the results are inspected point by point. As this method is very cost-intensive for some years there has been a trend to use simulations to predict the nature of a circuit which will actually be produced by a particular manufacturing process. Current optical microlithography simulators are very precise in operation but require very high computing power. For this reason simulation can only be carried out in a microscopically small area, typically several $\mu m^2$. As it is generally not known which specific parts of a design are critical, especially in large integrated circuits, such simulation, which is carried out, for example, only in specific areas, does not constitute an adequate test of the accuracy or functioning abilities of a circuit.

The invention sets out to simulate designs for electronic circuits as a whole within a reasonable time, preferably overnight, with a knowledge of the planned process technology, particularly the complete process technology.

This problem is solved by a process having the features of claim 1, an apparatus having the features of claim 10, a computer programme having the features of claim 12, a computer programme product having the features of claim 13 and an integrated circuit having the features of claim 14.

According to the invention a virtual or simulated image of an integrated circuit is obtained which can be compared with an imagined or original design of the circuit. According to the invention it is easily possible to specify the points of the (simulated) circuit which differ from a rated value by more than a corresponding tolerance value.

Using the teaching according to the invention also provides an automatic detection of weak spots as the operator is no longer obliged to specify the precise points of a design at which simulation is to be carried out, as was previously the case (up till now this was necessary as the areas which could be simulated at reasonable cost were very small). This meant that in previous processes the user had to know the latent weak spots. It is possible according to the invention to enlarge the areas to be simulated, compared with conventional solutions, by several orders of magnitude.

By using the process according to the invention it is possible to improve a circuit design or the process conditions for producing it so that weak points can be minimised or, in the best case, eliminated altogether.

Technologically important marginal conditions (boundary conditions) such as design rules or process windows, for example, should be taken into account.

Advantageous embodiments of the invention are recited in the subsidiary claims.

Preferably, an aerial image and/or a resist image and/or etched image of the circuit is prepared as a computer-simulated image.

Expediently, the simulated image, particularly the resist image, is prepared assuming a uniform propagation of a surface function $S(x,y,z)$, particularly a function which describes the propagation of a surface in a resist or photoresist to be simulated under illumination. This assumption has proved to be very favourable for performing the calculations used within the scope of the simulation according to the invention. Conventionally, in computer simulations, it has always been assumed that propagation of the resist surface initially took place perpendicularly to the resist and thereafter parallel to it. Apart from the fact that a model of this kind does not adequately describe the physical reality, the computing power involved in this was considerable.

It is preferable that the simulated image, particularly the resist image, be calculated using an equation of the form $$\left(\frac{\partial S}{\partial x}\right)^2 + \left(\frac{\partial S}{\partial y}\right)^2 + \left(\frac{\partial S}{\partial z}\right)^2 = \left(\frac{I(0)}{I(x,y,z)}\right)^{2\gamma}\left(\frac{1}{r_0}\right)^2$$

$I(x,y,z)$ is the intensity of the light used to illuminate the resist at a point $(x,y,z)$ on the resist, $I(0)$ is a reference intensity which can be derived from an equation $I(0)=E_0/E$ (where E is the incident light dose at a point $(x,y,z)$ and $E_0$ is a reference dose, $\gamma$ is a sensitivity or non-linearity parameter which describes, in particular, the non-linearity of a developing or resist process, and $r_0$ is a factor which can be derived from the equation $D_{\mathit{eff}}=r_0 \cdot t$, where $D_{\mathit{eff}}$ is an effective resist thickness and t is the developing time. The partial differential equation thus provided has been found to be soluble numerically or analytically, the analytical solution requiring considerably less computing time than conventional methods.

Conveniently, an intensity distribution of the form $I(x,y,z)=I(x,y)e^{-\alpha z}$ is used as the starting point. This assumption is referred to as a thin film approximation. It is assumed that the chemical composition of the resist in question is homogeneous, for which an absorption law can be provided. Under this assumption the surface function $S(x,y,z)$ can be given in the form $S(x,y)e^{\alpha\gamma z}$.

According to a preferred embodiment of the process according to the invention, when calculating the computer-simulated image of the circuit, it is assumed that $\gamma \gg 1$. With this assumption the partial differential equation for $S(x,y,z)$ provided above can be solved analytically in a particularly simple manner. The condition $\gamma \gg 1$ follows or can be derived from experimental data if $\gamma$ is regarded as the sensitivity of the resist used.

Assuming $\gamma \gg 1$ a solution to the above-mentioned partial differential equation can be given in the form $$S(x,y,z) = \frac{1}{r_0\gamma}\left(\frac{E_0}{EI(x,y,z)}\right)^\gamma \frac{1}{\sqrt{\left(\frac{\partial \ln I}{\partial x}\right)^2 + \left(\frac{\partial \ln I}{\partial y}\right)^2 + \left(\frac{\partial \ln I}{\partial z}\right)^2}}$$

where the values $S(x,y,z)=t$ constitute the areas of the resist profile developed at a fixed developing time t (starting from time t=0 at the start of the development).

According to a particularly preferred embodiment of the process according to the invention the resist profile developed is represented as $$z(x,y) = d\left(1 - \frac{1}{\alpha\gamma d}\ln\left(1 + D_{\mathit{eff}}\gamma\left(\frac{EI(x,y)}{E_0}\right)^\gamma F(x,y)\right)\right),$$

wherein $$F(x,y) = \sqrt{\left(\frac{\partial \ln I(x,y)}{\partial x}\right)^2 + \left(\frac{\partial \ln I(x,y)}{\partial y}\right)^2 + a^2}.$$

This equation starts from the thin film approximation or a describability of the intensity I in the form $I(x,y,z)=I(x,y)e^{-\alpha z}$.

According to another preferred embodiment of the process (method) according to the invention, a hierarchically structured data input quantity describing the design is processed, and in particular the simulated image is also provided in the form of a hierarchical structuring. This further reduces the necessary computing power or computing time compared with conventional methods.

According to a preferred embodiment of the apparatus according to the invention, it has means for, in particular, automatically changing simulation parameters. With such means it is possible to bring an initially inadequate simulation to convergence in optimum manner.

The invention will now be explained in more detail with reference to the accompanying drawings, wherein.

Figure 1:
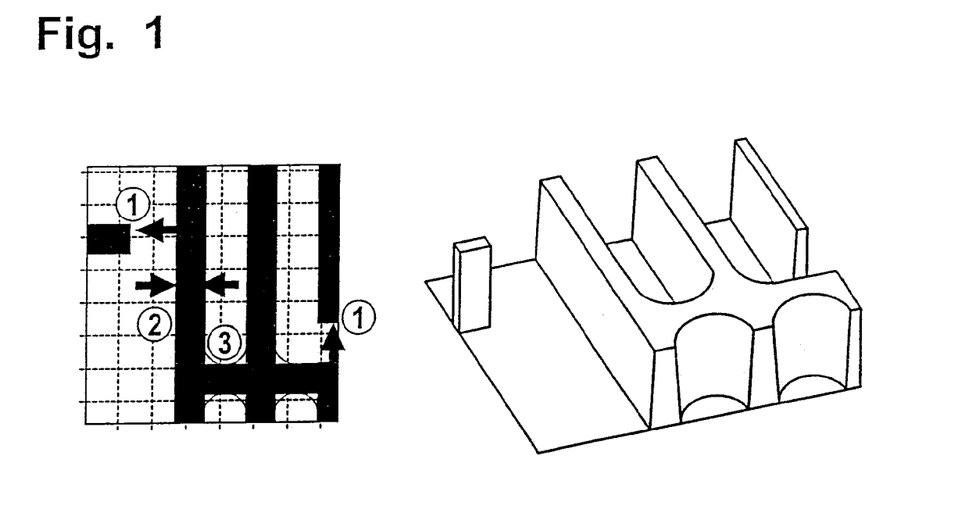
FIG. 1 shows by way of example details of an integrated circuit viewed from above and in perspective.

FIG. 1 shows, on the left, a detail of a design of an integrated circuit. The circuit areas are shown in black. The areas in question are visible as areas in relief in the illustration on the right. It should be assumed that the illustration on the right is the associated resist structure obtained under specific lighting conditions. If the image is cut horizontally at the foot of the resist, the dotted section lines of the left hand view are obtained. The juxtaposition shows that the results of this lithography section, the so-called resist mask, can differ substantially from the design. Some rule infringements are marked by numbers.

Thus 1 denotes a shortening of a line, 2 indicates changes in the width of a line and 3 denotes rounded-off corners.

Rule infringements of this kind have to fall within certain tolerance ranges. In FIG. 1 a resist mask is compared with a design, by way of example. The production of a resist mask constitutes part of a total manufacturing process for an integrated circuit. Typical steps will be briefly summarised here:

First of all, a design of a circuit is transferred to a mask by means of a mask writer. By using this mask in an optical projection apparatus, a so-called stepper, the mask structure is projected onto a silicon chip coated with a resist and having a layered structure. The image produced at the level of the resist surface is referred to as the aerial image. More precisely, the aerial image describes the three-dimensional distribution of intensity of the light close to the resist surface. It is possible to computer-simulate the resulting aerial image taking account of projection parameters, inter alia. Illumination of the resist carried out in this way leads to a photochemical reaction of the illuminated parts of the resist. When the illumination step is simulated, the computer calculates from the aerial image how the optical waves will be reflected on the silicon chip, depending on the structure of the resist and the laminar structure, and form standing waves. From this distribution of intensity it calculates how the photosensitive component of the resist will react and lead to a new starting component, the concentration map of which is stored in a latent image (resist image). Subsequently, during tempering, the diffusion of the reaction products is calculated and at the same time the reaction kinetics of the chemical reinforcing mechanism are calculated. Then the latent image (resist image) is developed by wet chemicals so as to produce a lasting resist structure. It is also possible to simulate the developing process. As a rule, this resist structure acts as a resist mask during the subsequent etching. Thus, a permanent structure is produced in the silicon (etched image) while all previous images are transient in nature. It is also possible to simulate the etching process.

Nowadays, in practice, the etching is usually carried out as reactive ion etching.

Figure 2:
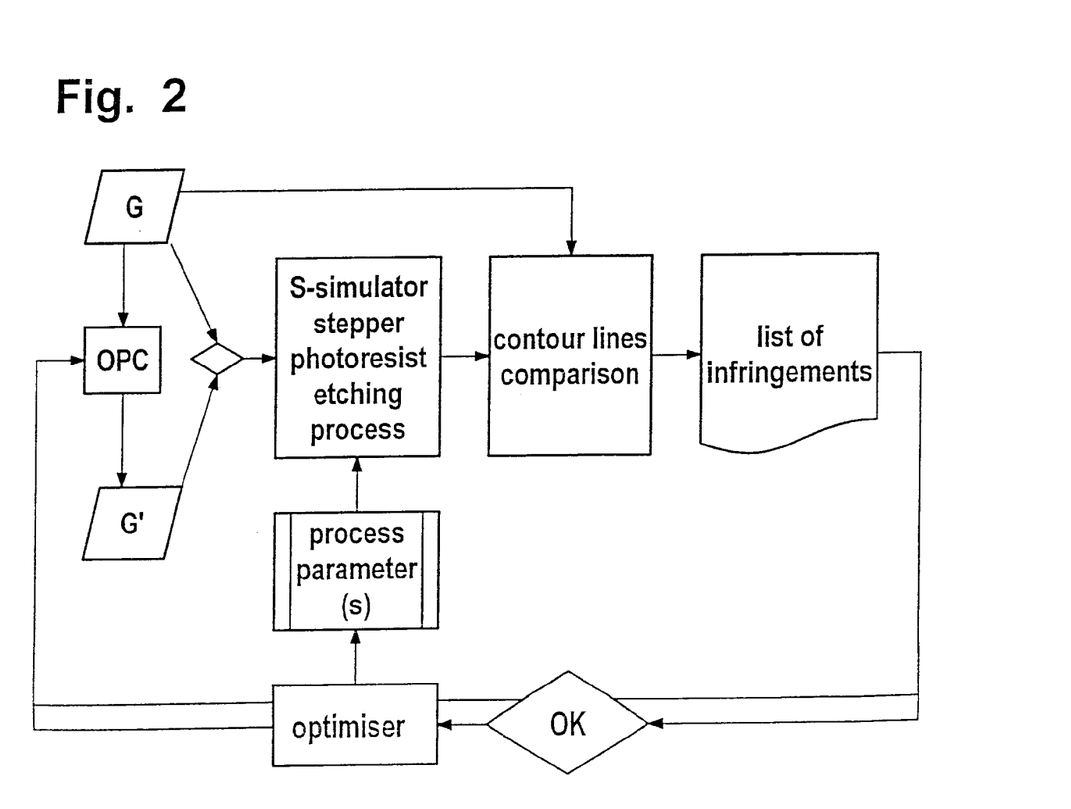
FIG. 2 is a flow diagram for illustrating a preferred embodiment of the process according to the invention.

The principle of the simulation process according to the invention will now be described with reference to FIG. 2.

Inspection of an integrated or printed circuit to find any rule infringements can be carried out according to the invention by introducing the design, described by a geometric set $\{G\}$ or a geometric set $\{G'\}$ corrected for an optical proximity effect, into a simulating apparatus which calculates a geometric set $\{G''\}$ which corresponds to selectable aspects of the integrated circuit. For this, the simulating apparatus uses different modules for the process steps and the associated parameters. The aerial images, resist images or etched images mentioned previously are possible aspects, for example. Comparison for correctness of the simulated or calculated integrated circuit can be carried out according to the invention by comparing the geometric set $\{G2'\}$ with the design originally imagined $\{G\}$. For this, it is possible according to the invention, for example, to calculate the contour lines in the set $\{G2'\}$ and compare them with the design $\{G\}$. It is important in the comparison that if a proximity correction is carried out the comparison is made with the set $\{G\}$ and not with the input data $\{G'\}$.

According to the invention, a set of design rules may also be used instead of the set $\{G\}$. In this case the design rules are expanded to include process rules which also have to be complied with. These include, for example, the rule that the depth of field in the lithography process must not fall below a minimum. If there are infringements of the rules, they are expediently listed and the list is produced or displayed.

The results of the comparison can be provided in a list of rule infringements. Depending on the results of this comparison or the contents of the list the process parameters can be modified by means of an optimiser so that modified simulation can be carried out. This possibility is diagrammatically shown in FIG. 2.

As already mentioned, the invention sets out to accelerate the simulation by having at least one of the individual steps of the simulation calculated by a suitable high speed algorithm. In particular, it sets out to provide a high speed aerial image calculation and/or a high speed resist image calculation and/or a high speed etched image calculation.

The invention provides, for the first time, analytical solutions or approximations which are faster by several orders of magnitude than the non-analytical (i.e. numerical) processes used hitherto. However, it is also possible to solve the equations proposed according to the invention numerically, and here again the calculations are carried out substantially faster than in conventional solutions. By way of example we refer here in particular to a method of rapidly calculating a resist image (i.e. simulating a developing process). It is assumed according to the invention that the resist surface will propagate in every direction (e.g. during the developing). This means that an area of resist which changes chemically or is changed chemically as a result of the illumination will spread in every direction. In conventional models it was assumed that the surface of the resist would propagate initially in one direction (for example perpendicular to the surface of the resist), and then in a direction perpendicular thereto (e.g. parallel to the surface of the resist). The assumption according to the invention that the resist surface propagates in every direction simplifies the algorithms, as will be explained in more detail hereinafter. We should point out here that the rate of propagation depends on the contrast of the resist used and the (x,y,z) distribution of intensity in the resist. On the assumption that the thin film approximation according to which the chemical composition of the resist is homogeneous (for which an absorption law can be provided) can be applied in the direction defined by the illumination (i.e. perpendicular to the surface of the resist), the rate of propagation of the resist surface can be described as a function of an (x,y) distribution of the intensity. Letters x and y denote linearly independent directions parallel to the surface of the resist.

Figure 3:
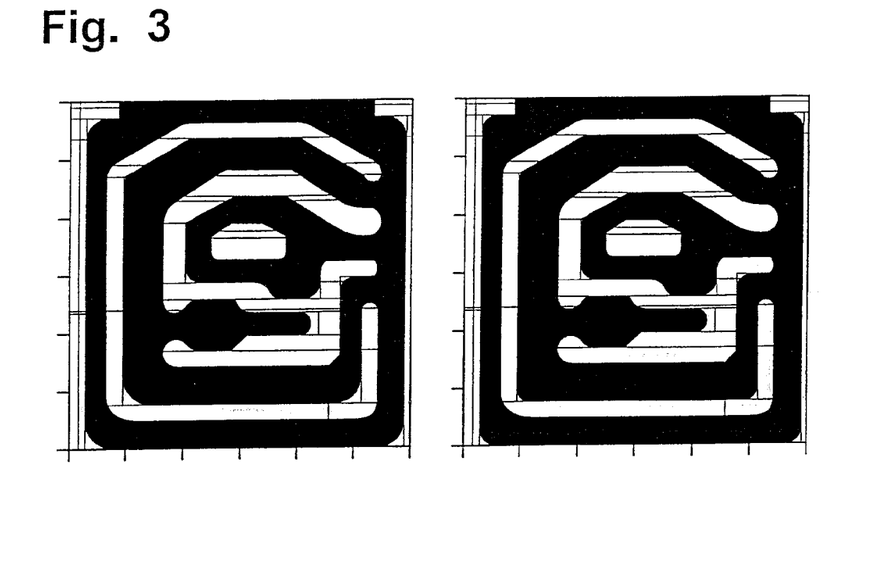
FIG. 3 shows resist images calculated using a conventional full simulation or using the process according to the invention.
Figure 4:
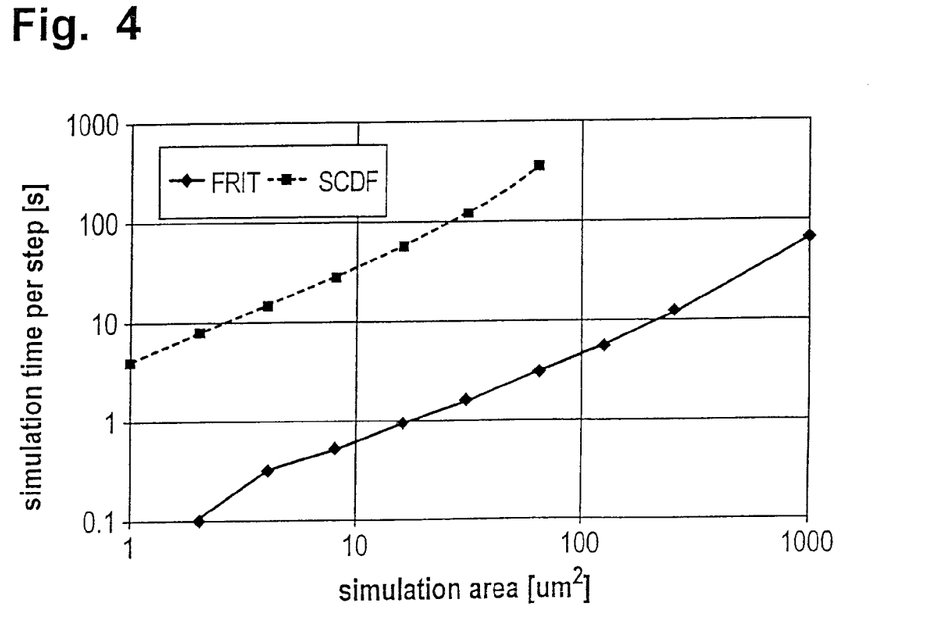
FIG. 4 is a diagram for comparing the computing time required when using the process according to the invention with the computing time needed in conventional processes, in each case as a function of the area calculated or simulated.

In this connection reference is made to FIG. 3. This shows simulations of horizontal sections through the photoresist after development. The left hand image has been produced by total digital simulation and the right hand image by the high speed approximation proposed according to the invention using the assumptions described above. It will be appreciated that the differences between the two images are minimal but the time saving which can be achieved according to the invention is considerable. In this embodiment the time advantage and hence the saving of area is about two orders of magnitude. This is shown in FIG. 4. Here, the computing time required as a function of the surface area is shown for conventional processes (dotted line) and the high speed approximation according to the invention (continuous line). Reading off the logarithmic Y axis the increase in speed amounts to about two orders of magnitude.

The mathematical correlations on which the simulation according to the invention is based will be explained more fully hereinafter.

The case of the propagation of a contour profile (or a surface) in the photoresist during a development process will be looked at by way of example.

The propagation of a contour profile can be described within the framework of a stationary level-set formulation. Let us start with the two dimensional case in which the surface or the propagating contour profile is a propagating curve. First of all the evolving or propagating zero-level set is generated above the X-Y plane. Let $S(x,y,z)$ be the developing time t at which the curve crosses the point $(x,y,z)$. The surface $S(x,y,z)$ in this case satisfies the equation $$|\nabla S|r = 1 \quad (1)$$

introduced by Osher and Sethian (J. A. Sethian, Level Set Methods, University of California, Berkeley, 1996) wherein r is the speed function or a function which describes the rate of development of the resist.

If the speed function r depends only on the position, the eiconal equation known from optics is obtained.

Finally, the position of the front $\Gamma$ is defined by the level set of the time of the function $S(x,y,z)$, as a result of which $$\Gamma(t) = \{(x,y,z) | S(x,y,z) = t\} \quad (2)$$

is obtained. The shape of the resist profile finally produced can be calculated from equations 1 and 2, while appropriately the speed function is defined as the development rate function which describes the rate of development $r(x,y,z)$ as a function of the intensity $I(x,y,z)$ of the aerial image:

$$r(x, y, z) = r_0 \left(\frac{I(x, y, z)E}{E_0}\right)^\gamma = r_0 \left(\frac{I(x, y, z)}{I(0)}\right)^\gamma \quad (3)$$

E describes the dose given in large, uncovered or exposed areas of the resist or resist surface, $E_0$ describes a threshold dose (particularly for resolving a development of the resist), $r_0$ is the development rate resulting from the condition $E \cdot I = E_0$, and $\gamma$ is a non-linearity parameter or sensitivity parameter which describes the non-linearity or sensitivity of the resist or of the resist development process.

An effective resist thickness $D_{eff} = r_0 t$ is now introduced. In mathematical terms $I(0) = E_0/E$.

In this way an intensity $I(x,y,z)$ of the aerial image is obtained which is standardised in the usual way, wherein $I(x,y,z) \to 1$ applies in large exposed areas.

It is now proposed according to the invention that equation 3 be inserted or substituted in equation 1, resulting in:

$$|\nabla S|r_0 = \left(\frac{I(0)}{I(x, y)}\right)^\gamma \quad (4)$$

Thus, in the two dimensional case, we obtain $$\left(\frac{\partial S}{\partial x}\right)^2 + \left(\frac{\partial S}{\partial y}\right)^2 = \left(\frac{I(0)}{I(x, y)}\right)^{2\gamma} \left(\frac{1}{r_0}\right)^2 \quad (5)$$

It can easily be shown that equation (5) in the one dimensional case is reduced to the equation specified by Mack in "Enhanced Lumped Parameter Model for Photolithography, SPIE, Vol. 2197/501, 1994" if the absorption coefficient is neglected.

Equation 5 can also be extended to include the three dimensional case. All in all this produces the equation $$\left(\frac{\partial S}{\partial x}\right)^2 + \left(\frac{\partial S}{\partial y}\right)^2 + \left(\frac{\partial S}{\partial z}\right)^2 = \left(\frac{I(0)}{I(x, y, z)}\right)^{2\gamma} \left(\frac{1}{r_0}\right)^2 \quad (6)$$

If, as already mentioned, it is assumed that in the direction z the thin film approximation which can be described as $$I(x,y,z) = I(x,y)e^{-\alpha z} \quad (7)$$

where $\alpha$ is the absorption coefficient of the resist under consideration or to be simulated is applicable, $S(x,y,z)$ can be written as follows:

$$S(x,y,z) = S(x,y)e^{\alpha \gamma z} \quad (8)$$

Equation (6) in this case can be shown as $$\left(\frac{\partial S}{\partial x}\right)^2 + \left(\frac{\partial S}{\partial y}\right)^2 + \alpha^2 \gamma^2 S^2 = \left(\frac{I(0)}{I(x, y)}\right)^{2\gamma} \left(\frac{1}{r_0}\right)^2. \quad (9)$$

From equation (9) marginal or boundry conditions can be obtained as to when it is possible to neglect the term containing the absorption coefficient:

$$\alpha \gamma x_{edge} \ll 1$$

$$\alpha \gamma y_{edge} \ll 1 \quad (10),$$

wherein $x_{edge}$ and $y_{edge}$ are the locations of the resist edges.

Assuming that $\gamma \gg 1$, the equation (6) describing the resist profile $S(x,y,z)$ can easily be solved analytically, assuming, as already mentioned, that $\gamma$ is the sensitivity of the photoresist used. $\gamma$ may be described in known manner by considering the relation between the dose of light acting on the resist and the depth of the resist (taken to start from the surface of the resist).

On the above mentioned assumption $\gamma \gg 1$, the solution to equation (6) can be written as follows:

$$S(x, y, z) = \frac{1}{r_0 \gamma} \left(\frac{E_0}{EI(x, y, z)}\right)^\gamma \frac{1}{\sqrt{\left(\frac{\partial \ln I}{\partial x}\right)^2 + \left(\frac{\partial \ln I}{\partial y}\right)^2 + \left(\frac{\partial \ln I}{\partial z}\right)^2}} \quad (11)$$

The areas $$S(x,y,z) = t \quad (12)$$

describe the developed resist profile for a particular developing time t. The marginal condition for equation (12) consists in the fact that S(x,y,z) disappears on the original resist surface.

Equation (11) is the general solution to equation (6). Starting now from an intensity I(x,y,z) as described in equation (7), equations (11) and (12) give the following equation for the developed resist profile:

$$z(x, y) = d\left(1 - \frac{1}{\alpha\gamma d}\ln\left(1 + D_{\mathit{eff}}\gamma\left(\frac{EI(x, y)}{E_0}\right)^\gamma F(x, y)\right)\right). \quad (13)$$

Here, F(x,y) can be written in the form $$F(x, y) = \sqrt{\left(\frac{\partial \ln I(x, y)}{\partial x}\right)^2 + \left(\frac{\partial \ln I(x, y)}{\partial y}\right)^2 + \alpha^2}. \quad (14)$$

Moreover, d is the thickness of the resist, $D_{\mathit{eff}}$ is the above mentioned effective resist thickness and $\alpha$ is the absorption coefficient of the resist.

It should be pointed out once more that the resist profile thus calculated or simulated depends on the intensity of the aerial image I(x,y).

All in all, a very simple analytical equation for a definition or representation of a resist profile is obtained according to the invention without the need to introduce or consider chemical parameters. The process put forward is based exclusively on physical designs and parameters and enables a resist profile for large areas to be calculated very rapidly. The model envisaged is two orders of magnitude faster than conventional total simulations of a resist profile based on chemical conceptions.

Using the algorithm provided here, simulations of resist images can be substantially speeded up compared with conventional methods. Equations (6) or (9) can be solved analytically or numerically, these two types of solution being substantially faster and more effective to carry out than the models or algorithms conventionally used.

For the sake of completeness here are some remarks on the level set formulation. As mentioned under equation (2) hereinbefore it is possible to formulate a stationary level-set equation in which the position of the front $\Gamma$ is provided by the level set of the value t of the function S(x,y,z), as follows from equation (2). In the time dependent level set equation the position of the front $\Gamma$ at a time t is given by the zero level set of a function $\rho$ at a time t, i.e. $\Gamma(t)=\{(x,y)|\Delta(x,y,t)=0\}$.

According to another alternative embodiment of the invention which may for example be used in addition or instead of the algorithm described above, the simulation can be further speeded up by using a hierarchy which is present in the design. The hierarchy contained in the design can be used by suitably running the hierarchy tree from bottom to top leaf for leaf and at the same time ensuring consistency at the edges of the leaf. In this way the computing time can be reduced by several orders of magnitude depending on the hierarchy level.

One essential idea in hierarchical working is to work on the hierarchy tree itself instead of an expanded flat design. If the design contains a number of repeating structures, only the various types are stored instead of the many individual structures. At the points where they occur a pointer indicates the structure in question.

A main problem of hierarchical working is guaranteeing consistency at the boundaries of the cells (or leaves). According to the process now proposed, this is done by surrounding each cell with a border before the actual data processing, corresponding to the extent of the physical effects to be taken into consideration, which are just being dealt with or have to be taken into account.

This preliminary stage is useful as it is now possible to take account of the environment of a cell when calculating the cell content. The border is not used again afterwards. The addition of the border picks up various neighbourhoods depending on where the cell is called up. This means that the hierarchy breaks down to some extent. For this purpose it has proved useful to introduce a hierarchy factor which quantitatively determines how great the degree of compaction is when the hierarchy tree is compared with the flat design. Expediently, this factor is defined by $$PHF_{subtree} = \frac{n}{n_{SVar}}, \quad (15)$$

wherein n is the number of all the elements in the flat design and $n_{SVar}$ is the corresponding quantity in the tree or in a branch of the tree. By definition PHF is greater than or equal to 1. $n_{SVar}$ can be calculated after running through the preliminary stage in order to be able to decide correctly afterwards whether to carry out a flat or hierarchical treatment. Once the modified tree has been produced which contains the cells and variants of the cells which do not differ in the cell contents but only in their environment, the actual calculation of the physical effects can begin by calculating all the cell variants. If PHF is significantly greater than 1, this factor of time is gained.

The comparison of the geometric sets {G"} with {G} or {G'}, mentioned hereinbefore, requires, for example, calculation of the distances within a figure along the curved contour lines and comparison with a linear rated geometry. Similarly, the distance from neighbour to neighbour must be calculated along curved contour lines and compared with a linear rated geometry. According to the invention these calculations are also carried out on a hierarchical data set. In this way the computing time can be further shortened substantially or the useable surface area can be increased. The results of the comparison are conveniently provided in a list of coordinates with the actual and rated values of the distances. The lists are sorted according to various criteria in the invention in order to show up any possible common causes for the infringements. Frequency distributions are plotted on the x,y plane, grouped for example according to cells or figure type, e.g. single cell lines, bars and ditches (channels), or contact holes.

According to the invention the infringements of the rules can be minimised by repeatedly carrying out the inspection process after specific changes have been made to the process conditions. For this purpose the system determines the parameter changes which effect the best improvement, according to the method of the steepest gradient. In the first stage of development, semi-automatic operation is provided in which the user initiates repetition of the process. In a second development stage the optimisation is carried out automatically until the process has converged. The stoppage criteria can be selected by the user from a certain range, according to the invention.

When using the process according to the invention it is possible to a large extent to retain a hierarchy tree of a design during simulating data processing. The difficulty is that in a strictly hierarchical process, i.e. operation by cells, the calculation is carried out as though the cell had no neighbours. However, depending on the physical effect, neighbouring cells may have widely differing effects on the cell to be processed, as already mentioned.

The proposed method according to the invention thus consists in providing the possible different neighbourhoods for each cell and storing them in a new hierarchy tree. Variants of the cells of this kind are referred to as tiles. Each tile is thus surrounded by a border which corresponds to the width of the area of influence of the neighbouring cells on a particular cell in question. The tree which forms is generally less compact than the original one but constitutes the most compact description of the hierarchy tree in the event that the underlying physical effects are noted, which naturally do not stop at cell boundaries.

In the newly formed hierarchy tree all the tiles can be processed individually in terms of their physical effects. Once the borders have been cut the design is obtained in the image of the physical effect under investigation. The time saving compared with conventional solutions is provided, as a first approximation, by the ratio of the sum of the surfaces in the tree of tiles to the surface of the unfolded design.

Calculation of the aerial image may be mentioned by way of example. First of all the tiles are produced, the range of influence being given in this case by the extent of the optical interferences. According to the theory of light scattering, the extent is estimated by first stating, for example, that the intensity of the secondary maxima has fallen below a threshold of e.g. 1%. In practice a range of n·λ/Na is selected, where n is approximately 10. When all the tiles including the seams are calculated, the borders can then be cut off and after the propagation of the entire hierarchy tree the aerial image of the complete design is obtained.

According to the invention the list of infringements of rules which is obtained when comparing a simulated image with the original design can be used to perfect the results. Former algorithms for the steps of image production, image transmission and structure transmission cannot be analytically formulated in closed terms. According to the invention there are analytical descriptions for the three steps. These functions can also be differentiated so that a solution vector can be given for improving the characteristics.

In a first step the user has, for example, the opportunity to manually select a set of parameters which are to be optimised. In contrast to existing methods of linear optimisation the process according to the invention is non-iterative in this case provided that the derivation is linear. If it is iterative it has substantially faster convergence characteristics than conventional processes or algorithms.

In a second step optimisation occurs automatically. For this, all the derivations are formed at the points of maximum rule infringements and then the parameters which produce particularly major changes are filtered out.

Existing inspection apparatus, particularly the "die-to-database" inspection apparatus mentioned at the beginning of the description, are of particular interest for the present invention as they carry out a comparison between an intended structure and an actual image. However, the apparatus according to the invention (inspection apparatus) does not provide a genuine measured image but rather a calculated or simulated image. Thus, the above mentioned steps of image production, image transmission and structure transmission have to be carried out virtually, i.e. the image or partial images have to be offered to the inspection apparatus in the form in which the measured image looks according to the calculation or simulation. The subsequent comparison takes place in the same way as in conventional die-to-database inspection equipment, for example. The algorithms explained above are produced as actual hardware modules, in which the parallelisation of the modules is of major importance as the measuring process takes place much faster than the calculation. The optimisation is treated as in the solution as a software programme.

The process proposed according to the invention is thus similar to the above mentioned die-to-database inspection process. However, unlike the above-mentioned process, the invention does not bring to light any defects in an actual circuit or mask but rather the system-produced deviations of the technology process and weak points in the design or the design altered by proximity correction.

Using the invention it is easily possible, among other things, to filter the weak points automatically out of the calculated images and list them.

According to the invention it has proved particularly advantageous that the measurement of the distances between objects can be carried out on any plane of the image within the simulated circuit (or comparison therewith with the circuit design). This has the advantage of a stepwise process when producing the algorithm shown. Thus, for example, the analysis may be carried out on the plane of the aerial image, the resist image or latent image or the etched image or structural image.

The distances are conveniently calculated in two stages. First of all the interior of the figure is run through to check whether the widths fall within a given range (usually +/−10%). Then the distances between the figures are calculated, again paying attention to the design rules and/or having to carry out a comparison with the original design.

What is claimed is:

1. A method for determining integrity of an integrated circuit, comprising:
   determining a simulated resist image for an integrated circuit, wherein determining a simulated resist image involves using an equation of the form $$\left(\frac{\partial S}{\partial x}\right)^2 + \left(\frac{\partial S}{\partial y}\right)^2 + \left(\frac{\partial S}{\partial z}\right)^2 = \left(\frac{I(0)}{I(x,y,z)}\right)^{2\gamma}\left(\frac{1}{r_0}\right)^2,$$

wherein $I(x,y,z)$ is intensity used to illuminate the resist at a point $(x,y,z)$ of the resist, $I(0)$ is reference intensity obtainable from equation $I(0)=E_0/E$, where E is incident light dose in large exposed areas of the resist and $E_0$ is a threshold, $\gamma$ is a non-linearity parameter describing non-linearity of one of a developing or resist process, and $r_0$ is a factor obtainable from equation $D_{eff}=r_0 \cdot t$, wherein $D_{eff}$ is effective resist thickness and t is developing time;
   comparing the simulated resist image of the circuit with a design of the circuit to obtain predictions about a circuit obtainable in a manufacturing process; and
   detecting deviations between the simulated resist image and the design which differ from a rated value by more than a tolerance value,
   the simulated resist image having a surface function of the form $S(x,y,z)$ describing uniform propagation of a surface in a resist to be simulated under illumination.

2. The method according to claim 1, further comprising utilizing an intensity distribution in the resist of the form $I(x,y,z)=I(x,y)e^{-\alpha z}$.

3. The method according to claim 1, the step of determining the simulated resist image comprising utilizing $\gamma \gg 1$.

4. A method according to claim 1, the step of determining the simulated resist image comprising utilizing an equation of the form $$S(x, y, z) = \frac{1}{r_0 \gamma} \left(\frac{E_0}{EI(x, y, z)}\right)^\gamma \frac{1}{\sqrt{\left(\frac{\partial \ln I}{\partial x}\right)^2 + \left(\frac{\partial \ln I}{\partial y}\right)^2 + \left(\frac{\partial \ln I}{\partial z}\right)^2}}.$$

5. The method according to claim 1, the step of determining the simulated resist image comprising utilizing an equation of the form $$z(x, y) = d\left(1 - \frac{1}{\alpha \gamma d} \ln\left(1 + D_{\textit{eff}} \gamma \left(\frac{EI(x, y)}{E_0}\right)^\gamma F(x, y)\right)\right)$$

wherein $$F(x, y) = \sqrt{\left(\frac{\partial \ln I(x, y)}{\partial x}\right)^2 + \left(\frac{\partial \ln I(x, y)}{\partial y}\right)^2 + \alpha^2}.$$

6. The method according to claim 1, further comprising processing a hierarchically structured data input set describing the design and providing the simulated resist image in the form of a hierarchical structuring.

7. Apparatus for determining integrity of an integrated circuit comprising:
   means for determining a simulated resist image of the integrated circuit, the simulated resist image being determined by an equation in the form $$\left(\frac{\partial S}{\partial x}\right)^2 + \left(\frac{\partial S}{\partial y}\right)^2 + \left(\frac{\partial S}{\partial z}\right)^2 = \left(\frac{I(0)}{I(x, y, z)}\right)^{2\gamma} \left(\frac{1}{r_0}\right)^2,$$

wherein I(x,y,z) is intensity of light used to illuminate the resist at point (x,y,z) of the resist, I(0) is reference intensity obtainable from equation I(0)=$E_0$/E, where E is incident light dose in large exposed areas of the resist and $E_0$ is a threshold, γ is a non-linearity parameter describing non-linearity of one of a developing or resist process, and $r_0$ is a factor obtainable from equation $D_{\textit{eff}}$=$r_0$·t, wherein $D_{\textit{eff}}$ is effective resist thickness and t is developing time; and
   means for comparing the simulated resist image with a design of the circuit to make predictions concerning a circuit obtainable in a manufacturing process, the means for comparing detecting deviations between the simulated resist image and the design which differ from a rated value by more than a tolerance value, the simulated resist image having a surface function S(x,y,z) describing a uniform propagation of a surface in a resist to be simulated under illumination.

8. The apparatus according to claim 7, an intensity distribution in the resist being of the form I(x,y,z)=I(x,y)$e^{-\alpha z}$.

9. The apparatus according to claim 7, wherein γ>>1.

10. The apparatus according to claim 7, the means for determining utilizing an equation of the form $$S(x, y, z) = \frac{1}{r_0 \gamma} \left(\frac{E_0}{EI(x, y, z)}\right)^\gamma \frac{1}{\sqrt{\left(\frac{\partial \ln I}{\partial x}\right)^2 + \left(\frac{\partial \ln I}{\partial y}\right)^2 + \left(\frac{\partial \ln I}{\partial z}\right)^2}}.$$

11. The apparatus according to claim 7, the means for determining utilizing an equation of the form $$z(x, y) = d\left(1 - \frac{1}{\alpha \gamma d} \ln\left(1 + D_{\textit{eff}} \gamma \left(\frac{EI(x, y)}{E_0}\right)^\gamma F(x, y)\right)\right)$$ wherein $$F(x, y) = \sqrt{\left(\frac{\partial \ln I(x, y)}{\partial x}\right)^2 + \left(\frac{\partial \ln I(x, y)}{\partial y}\right)^2 + \alpha^2}$$

to determine the simulated resist image.

12. The apparatus according to claim 7, further comprising means for automatically changing parameters.

13. A software product comprising instructions, stored on computer-readable media, wherein the instructions, when executed by a computer, perform steps for determining integrity of an integrated circuit, comprising:
   determining a simulated resist image for an integrated circuit, wherein determining a simulated resist image involves using an equation of the form $$\left(\frac{\partial S}{\partial x}\right)^2 + \left(\frac{\partial S}{\partial y}\right)^2 + \left(\frac{\partial S}{\partial z}\right)^2 = \left(\frac{I(0)}{I(x, y, z)}\right)^{2\gamma} \left(\frac{1}{r_0}\right)^2,$$

wherein I(x,y,z) is intensity used to illuminate the resist at a point (x,y,z) of the resist, I(0) is reference intensity obtainable from equation I(0)=$E_0$/E, where E is incident light dose in large exposed areas of the resist and $E_0$ is a threshold, γ is a non-linearity parameter describing non-linearity of one of a developing or resist process, and $r_0$ is a factor obtainable from equation $D_{\textit{eff}}$=$r_0$·t, wherein $D_{\textit{eff}}$ is effective resist thickness and t is developing time;
   comparing the simulated resist image of the circuit with a design of the circuit to obtain predictions about a circuit obtainable in a manufacturing process;
   detecting deviations between the simulated resist image and the design which differ from a rated value by more than a tolerance value, and
   the simulated resist image having a surface function of the form S(x,y,z) describing uniform propagation of a surface in a resist to be simulated under illumination.

14. The software product according claim 13, further comprising utilizing an intensity distribution in the resist of the form I(x,y,z)=I(x,y)$e^{-\alpha z}$.

15. The software product according to claim 13, the step of determining the simulated resist image comprising utilizing γ>>1.

16. A software product according to claim 13, the step of determining the simulated resist image comprising utilizing an equation of the form $$S(x, y, z) = \frac{1}{r_0 \gamma} \left(\frac{E_0}{EI(x, y, z)}\right)^\gamma \frac{1}{\sqrt{\left(\frac{\partial \ln I}{\partial x}\right)^2 + \left(\frac{\partial \ln I}{\partial y}\right)^2 + \left(\frac{\partial \ln I}{\partial z}\right)^2}}.$$

17. The software product according claim 13, the step of determining the simulated resist image comprising utilizing an equation of the form $$z(x, y) = d\left(1 - \frac{1}{\alpha\gamma d}\ln\left(1 + D_{\mathit{eff}}\gamma\left(\frac{EI(x, y)}{E_0}\right)^\gamma F(x, y)\right)\right)$$

wherein $$F(x, y) = \sqrt{\left(\frac{\partial \ln I(x, y)}{\partial x}\right)^2 + \left(\frac{\partial \ln I(x, y)}{\partial y}\right)^2 + \alpha^2}.$$

18. The software product according to claim 13, further comprising processing a hierarchically structured data input set describing the design and providing the simulated resist image in the form of a hierarchical structuring.

19. An integrated circuit prepared by a process comprising:

determining a simulated resist image for an integrated circuit, wherein determining a simulated resist image involves using an equation of the form $$\left(\frac{\partial S}{\partial x}\right)^2 + \left(\frac{\partial S}{\partial y}\right)^2 + \left(\frac{\partial S}{\partial z}\right)^2 = \left(\frac{I(0)}{I(x, y, z)}\right)^{2\gamma}\left(\frac{1}{r_0}\right)^2,$$

wherein $I(x,y,z)$ is intensity used to illuminate the resist at a point $(x,y,z)$ of the resist, $I(0)$ is reference intensity obtainable from equation $I(0)=E_0/E$, where E is incident light dose in large exposed areas of the resist and $E_0$ is a threshold, $\gamma$ is a non-linearity parameter describing non-linearity of one of a developing or resist process, and $r_0$ is a factor obtainable from equation $D_{\mathit{eff}}=r_0 \cdot t$, wherein $D_{\mathit{eff}}$ is effective resist thickness and t is developing time;

comparing a simulated resist image of the integrated circuit with a design of the integrated circuit to obtain predictions about the integrated circuit obtainable in a manufacturing process; and detecting deviations between the simulated resist image and the design which differ from a rated value by more than a tolerance value;

the simulated resist image having a surface function of the form $S(x,y,z)$ describing uniform propagation of a surface in a resist to be simulated under illumination.

\* \* \* \* \*

UNITED STATES PATENT AND TRADEMARK OFFICE
CERTIFICATE OF CORRECTION

| | |
|---|---|
| PATENT NO. | : 7,302,090 B2 |
| APPLICATION NO. | : 10/433250 |
| DATED | : November 27, 2007 |
| INVENTOR(S) | : Christian K. Kalus et al. |

It is certified that error appears in the above-identified patent and that said Letters Patent is hereby corrected as shown below:

On the Title Page, Item 75, please delete the word "Müchen" and replace with the word --München--, so that the first-listed inventor's residence reads "München (DE)".

Signed and Sealed this

Fifteenth Day of April, 2008

JON W. DUDAS
*Director of the United States Patent and Trademark Office*